(12) United States Patent
Feng et al.

(10) Patent No.: US 9,559,176 B2
(45) Date of Patent: Jan. 31, 2017

(54) FINFET CONFORMAL JUNCTION AND ABRUPT JUNCTION WITH REDUCED DAMAGE METHOD AND DEVICE

(71) Applicant: GLOBALFOUNDRIES Inc., Grand Cayman (KY)

(72) Inventors: Peijie Feng, Clifton Park, NY (US); Yanxiang Liu, Glenville, NY (US); Shesh Mani Pandey, Clifton Park, NY (US); Jianwei Peng, Ballston Lake, NY (US); Francis Benistant, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/180,312

(22) Filed: Jun. 13, 2016

(65) Prior Publication Data

US 2016/0293718 A1 Oct. 6, 2016

Related U.S. Application Data

(62) Division of application No. 14/679,074, filed on Apr. 6, 2015, now Pat. No. 9,397,162.

(Continued)

(51) Int. Cl.
*H01L 29/08* (2006.01)
*H01L 29/417* (2006.01)
*H01L 29/78* (2006.01)
*H01L 29/06* (2006.01)
*H01L 29/45* (2006.01)

(Continued)

(52) U.S. Cl.
CPC ... *H01L 29/41791* (2013.01); *H01L 21/28512* (2013.01); *H01L 27/0924* (2013.01); *H01L 29/0649* (2013.01); *H01L 29/45* (2013.01); *H01L 29/785* (2013.01); *H01L 21/324* (2013.01); *H01L 21/823431* (2013.01)

(58) Field of Classification Search
CPC ........... H01L 29/41791; H01L 29/0649; H01L 29/45; H01L 29/785; H01L 27/0924; H01L 21/26586; H01L 21/3065; H01L 21/324; H01L 21/823821
USPC ........................................................ 257/288
See application file for complete search history.

(56) References Cited

U.S. PATENT DOCUMENTS 9,093,478 B1   7/2015   Cheng et al.
9,123,744 B1   9/2015   Liao et al.
(Continued)

*Primary Examiner* — Nathan W Ha
(74) *Attorney, Agent, or Firm* — Ditthavong & Steiner, P.C.

(57) ABSTRACT

A method of forming a source/drain region with abrupt vertical and conformal junction and the resulting device are disclosed. Embodiments include forming a first mask over a fin of a first polarity FET and source/drain regions of the first polarity FET; forming spacers on opposite sides of a fin of a second polarity FET, the second polarity being opposite the first polarity, on each side of a gate electrode; implanting a first dopant into the fin of the second polarity FET; etching a cavity in the fin of the second polarity FET on each side of the gate electrode; removing the first mask; performing rapid thermal anneal (RTA); epitaxially growing a source/drain region of the second polarity FET in each cavity; forming a second mask over the fin of the first polarity FET and source/drain regions of the first polarity FET; and implanting a second dopant in the source/drain regions of the second polarity FET.

20 Claims, 8 Drawing Sheets

Related U.S. Application Data

(60) Provisional application No. 62/097,422, filed on Dec. 29, 2014.

(51) Int. Cl.
  *H01L 27/092* (2006.01)
  *H01L 21/285* (2006.01)
  *H01L 21/324* (2006.01)
  *H01L 21/8234* (2006.01)

(56) References Cited

U.S. PATENT DOCUMENTS

| | | | |
|---|---|---|---|
| 2006/0084232 A1* | 4/2006 | Grupp | H01L 29/0895 438/291 |
| 2010/0148217 A1 | 6/2010 | Simonelli et al. | |
| 2012/0091538 A1 | 4/2012 | Lin et al. | |
| 2013/0049068 A1* | 2/2013 | Lin | H01L 29/7853 257/192 |
| 2013/0134506 A1* | 5/2013 | Yagishita | H01L 29/66545 257/330 |
| 2013/0187206 A1* | 7/2013 | Mor | H01L 29/66628 257/288 |
| 2013/0187228 A1 | 7/2013 | Xie et al. | |
| 2013/0277752 A1* | 10/2013 | Glass | H01L 21/823821 257/369 |
| 2014/0048857 A1 | 2/2014 | Cheng et al. | |
| 2014/0110784 A1 | 4/2014 | Jagannathan et al. | |
| 2014/0175561 A1* | 6/2014 | Colinge | H01L 29/785 257/401 |
| 2014/0197468 A1* | 7/2014 | Xie | H01L 29/78 257/288 |
| 2014/0264487 A1* | 9/2014 | Pham | H01L 29/78 257/288 |
| 2014/0312398 A1* | 10/2014 | Ching | H01L 29/66795 257/288 |
| 2014/0346600 A1 | 11/2014 | Cheng et al. | |
| 2014/0361336 A1 | 12/2014 | Chen et al. | |

\* cited by examiner

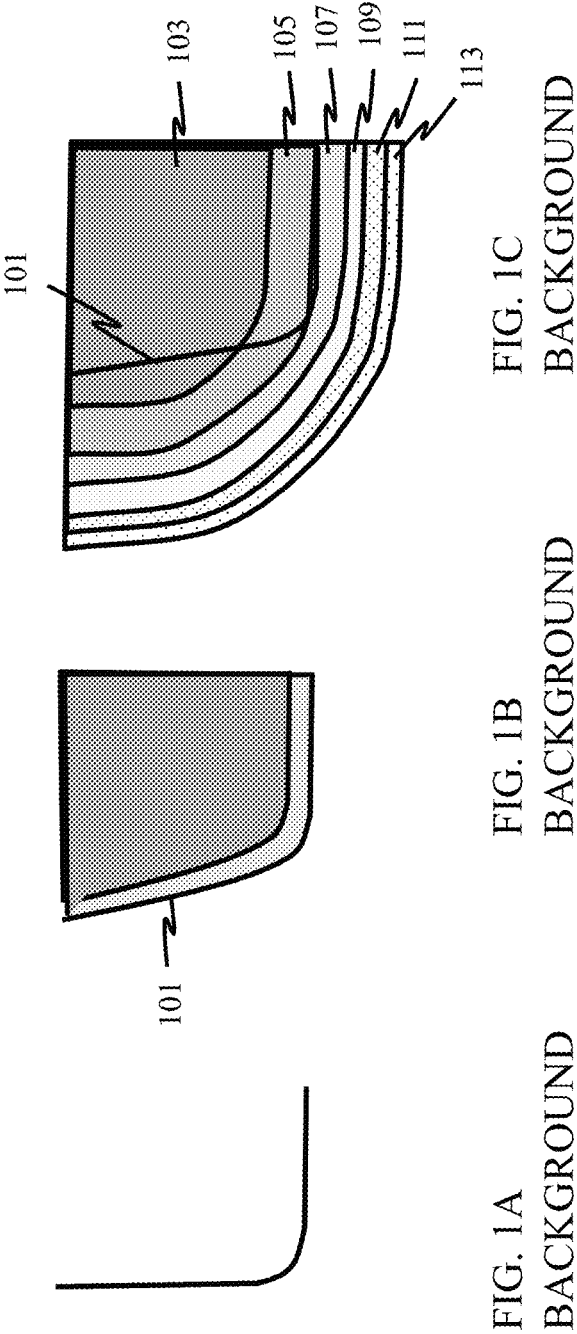

FINFET CONFORMAL JUNCTION AND ABRUPT JUNCTION WITH REDUCED DAMAGE METHOD AND DEVICE

RELATED APPLICATIONS

The present application is a Divisional of application Ser. No. 14/679,074, filed on Apr. 6, 2015, which claims priority to U.S. Provisional Application 62/097,422, filed Dec. 29, 2014, the disclosures of which are incorporated herein by reference in their entirety.

TECHNICAL FIELD

The present disclosure relates to fabrication of fin-type field effect transistors (FinFETs) with epitaxially grown source/drain regions. The present disclosure is particularly applicable to devices for the 14 nanometer (nm) technology node and beyond.

BACKGROUND

In current processes of forming cavities for epitaxial growth of source/drain regions, non-vertical cavity sidewalls are formed, and conventional source/drain implantations result in non-uniform doping profiles. Consequently, a non-conformal junction is formed which in turn leads to threshold voltage non-uniformity along the fin height. During the device operation, the non-conformal junction will prevent the fin active region from full utilization, and it also degrades channel resistance and spreading resistance. Besides, the junction invasion at the fin tip worsens short channel effects.

FIG. 1A illustrates a desired cavity sidewall. FIG. 1B illustrates an implant profile after source/drain implantation, which includes a sloped sidewall (at 101). Adverting to FIG. 1C, after all thermal processes, the resulting dopant profile forms a gradient with a decreasing concentration from 103 to 113. As illustrated in FIG. 2A, conventional low energy and heavy dose source/drain implantation after epitaxial growth aimed for ohmic contact will introduce excessive dopant at the fin tip region 201. If a moderate energy source/drain implantation is employed, the middle to bottom effective gate length Leff is slightly reduced, but the junction overall remain sloped in FIG. 2B. A high energy source drain implantation still cannot straighten the junction and it will cause serious tailing, as illustrated at 205 in FIG. 2C.

The conventional extension implantation techniques cannot straighten the junction. As illustrated in FIG. 3A, for FinFETs with fins 301 having a pitch 303 between 20 and 40 nm, extension implantation 305 is tilted with respect to the fins 301 to cover the entire fin sidewall. However, as illustrated in FIG. 3B, the resultant implantation 307 is non-conformal and non-uniform, and it will also cause both fin damage and junction uniformity issues. Thus, conventional implantation before or right after source/drain epitaxial growth will cause a graded junction, undesired junction tailing, a non-conformal junction, and fin damage.

A need therefore exists for methodology enabling formation of both a conformal junction with a high epi surface dopant concentration in a FinFET and the resulting device.

SUMMARY

An aspect of the present disclosure is a method of forming a FinFET including a high dose implant between forming spacers on the fin sidewalls and etching the source/drain cavity.

Another aspect of the present disclosure is a FinFET device having abrupt vertical and conformal junction.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first mask over a fin of a first polarity FET and source/drain regions of the first polarity FET; forming spacers on opposite sides of a fin of a second polarity FET, the second polarity being opposite the first polarity, on each side of a gate electrode; implanting a first dopant into the fin of the second polarity FET; etching a cavity in the fin of the second polarity FET on each side of the gate electrode; removing the first mask; performing rapid thermal anneal (RTA); epitaxially growing a source/drain region of the second polarity FET in each cavity; forming a second mask over the fin of the first polarity FET and source/drain regions of the first polarity FET; and implanting a second dopant in the source/drain regions of the second polarity FET.

Aspects of the present disclosure include implanting the first dopant at a dose of $1e14\ cm^{-3}$ to $1e16\ cm^{-3}$. Further aspects include implanting the first dopant at an energy of 3 kiloelectron Volts (keV) to 10 keV. Other aspects include implanting the first dopant with zero tilt with respect to the sidewall of the fin. Additional aspects include reducing a height of the spacers prior to etching the cavities. Further aspects include precleaning prior to epitaxially growing the source/drain regions of the second polarity FET. Other aspects include implanting the second dopant at a dose of $1e14\ cm^{-3}$ to $1e16\ cm^{-3}$. Another aspect includes implanting the second dopant at an energy of 0.5 keV to 5 keV. An additional aspect includes implanting the second dopant with zero degrees of rotation and with a maximum tilt respect to fin. Further aspects include the first and second dopants including arsenic.

Another aspect of the present disclosure is a device including: a PFET fin and an NFET fin on a substrate; a gate electrode over and perpendicular to the PFET fin and the NFET fin; PFET source/drain regions on the PFET fin at opposite sides of the gate electrode; and epitaxially grown, arsenic doped NFET source/drain regions in cavities in the NFET fin at opposite sides of the gate electrode, wherein the NFET source/drain region has a conformal junction with an abrupt, vertical, and conformal junction boundary.

Aspects include the epitaxially grown source/drain regions including silicon phosphide (SiP). Further aspects include the NFET fin being implanted with arsenic at a dose of $1e14\ cm^{-3}$ to $1e16\ cm^{-3}$, an energy of 1 kiloelectron Volt (keV) to 10 keV, and a zero degree tilt prior to formation of the cavities. An additional aspect includes the epitaxially grown source/drain region being doped with arsenic at a dose of $1e14\ cm^{-3}$ to $1e16\ cm^{-3}$, an energy of 0.5 keV to 5 keV, and a maximum tilt after the epitaxial growth.

Another aspect of the present disclosure is a method including forming a PFET fin and an NFET fin on a substrate; forming shallow trench isolation regions between the PFET fin and the NFET fin; forming a gate electrode over and perpendicular to the PFET fin and the NFET fin; forming PFET source/drain regions on the PFET fin at opposite sides of the gate electrode; forming a first mask over the PFET fin and PFET source/drain regions; forming spacers on sidewalls of the NFET fin on each side of the gate electrode; implanting arsenic into the NFET fin at a dose of 1e14 cm$^{-3}$ to 1e16 cm$^{-3}$ and with zero tilt with respect to the fin sidewall; reducing a height of the spacers; etching a cavity in the NFET fin on each side of the gate electrode; removing the first mask; performing rapid thermal anneal (RTA); epitaxially growing an NFET source/drain region in each cavity; forming a second mask over the PFET fin and PFET source/drain regions; implanting arsenic in the NFET source/drain regions at a dose of 1e14 cm$^{-3}$ to 1e16 cm$^{-3}$ and with zero degrees of rotation and a maximum tilt.

Aspects include implanting the arsenic into the NFET fin at an energy of 3 kiloelectron Volts (keV) to 10 keV and implanting the arsenic into the NFET source/drain regions at an energy of 0.5 keV to 5 keV. Another aspect includes removing the first mask by ashing and chemical cleaning. Further aspects include implementing RTA at a high temperature greater than 800° C. to repair fin damage, activate implanted dopant, and drive dopant diffusing into fin bottom region. Another aspect includes precleaning prior to epitaxially growing the NFET source/drain regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1A schematically illustrates a desired cavity sidewall;

FIG. 1B schematically illustrates an implant profile after source/drain implantation;

FIG. 1C schematically illustrates an implant profile after all thermal processes;

DETAILED DESCRIPTION

Figure 2B:
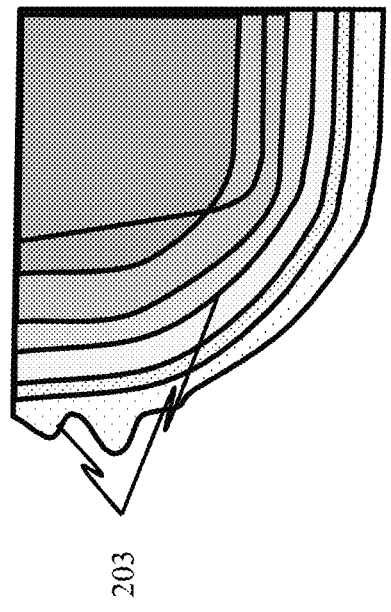
FIGS. 2A through 2C schematically illustrate implant profiles after conventional low energy, moderate energy, and high energy implantations, respectively.
Figure 2C:
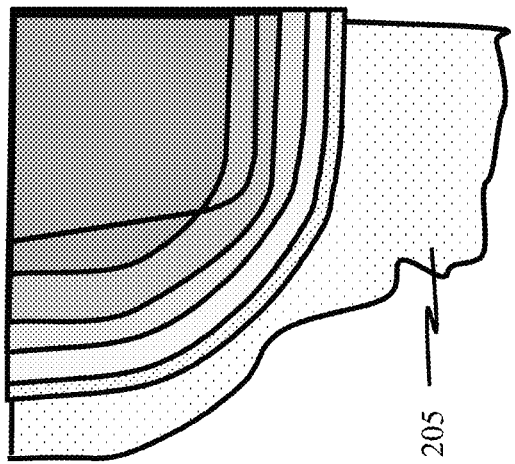
Figure 2A:
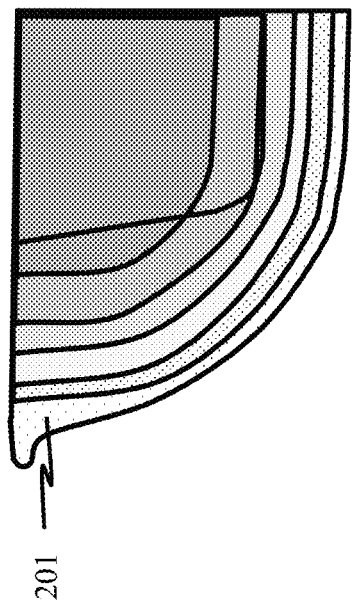
Figure 3B:
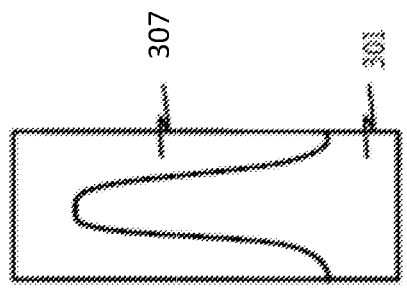
FIG. 3B schematically illustrates the implant profile resulting from the implantation shown in FIG. 3A.
Figure 3A:
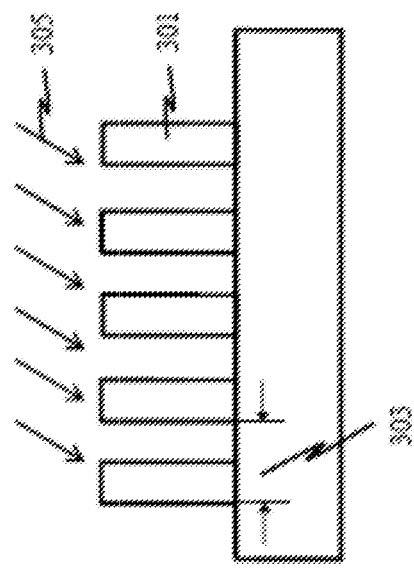
FIG. 3A schematically illustrates a tilted extension implantation for a FinFET with multiple fins.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of graded junctions, undesired junction tailing, non-conformal junctions, and fin damage attendant upon performing implantation for source/drain junction tuning and performance improvement. In accordance with embodiments of the present disclosure, an implantation is inserted before the source/drain cavity is etched or before the spacers are formed on the fin sidewalls to straighten the junction at the middle-to-bottom region. In addition, the top of the fin which becomes damaged is removed prior to growing the epitaxial source/drain regions, which also help straighten the cavity slope with flexible control of the epitaxial volume. Also, an RTA is inserted prior to the epitaxial growth to repair implantation and etch damage and to activate and drive in the dopant at the fin lower region. Further, a shallow implantation into the epitaxially grown source/drain regions limits the dopant diffusion into the channel and controls fin top dopant encroaching into the channel.

Methodology in accordance with embodiments of the present disclosure includes forming a first mask over a fin of a first polarity FET and source/drain regions of the first polarity FET and forming spacers on opposite sides of a fin of a second polarity FET, the second polarity being opposite the first polarity, on each side of a gate electrode. A first dopant is implanted into the fin of the second polarity FET, and a cavity is etched in the fin of the second polarity FET on each side of the gate electrode. The first mask is removed and a rapid thermal anneal (RTA) is performed. A source/drain region of the second polarity FET is epitaxially grown in each cavity. A second mask is then formed over the fin of the first polarity FET and source/drain regions of the first polarity FET, and a second dopant is implanted in the source/drain regions of the second polarity FET.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 4A through 4G schematically illustrate cross-sectional views across source/drain regions of a process flow, in accordance with an exemplary embodiment. Adverting to FIG. 4A, a silicon substrate 401 is illustrated with shallow trench isolation (STI) regions 403 on the substrate between fins 405 and 407. Fin 405 may, for example, be a PFET fin and fin 407 may then be an NFET fin. (It should be noted that similar methods can be applied when swapping the NFET and PFET to form a conformal junction in the PFET.) A source/drain region 409 is formed on fin 405, for example by epitaxially growing embedded silicon germanium (eSiGe) on fin 405 at each of opposite sides of a gate electrode over and perpendicular to fins 405 and 407 (not shown for illustrative convenience). A thin layer 411 of oxide or nitride is formed on source/drain regions 409 and on the STI regions 403 surrounding fin 405. A mask 413, e.g. a photoresist, is formed over the PFET to protect the PFET during processing of the NFET, which begins with layer 415 of oxide or nitride being formed over fin 407.

Figure 4B:
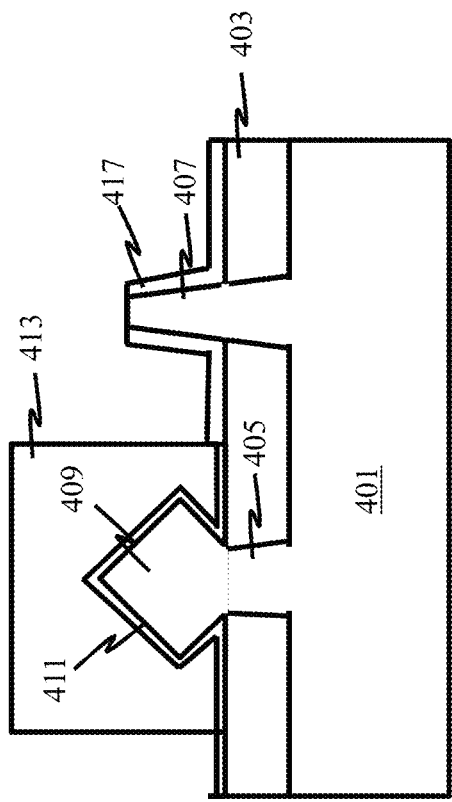
FIGS. 4A through 4G schematically illustrate cross-sectional views across source/drain regions of a process flow, in accordance with an exemplary embodiment.
Figure 4A:
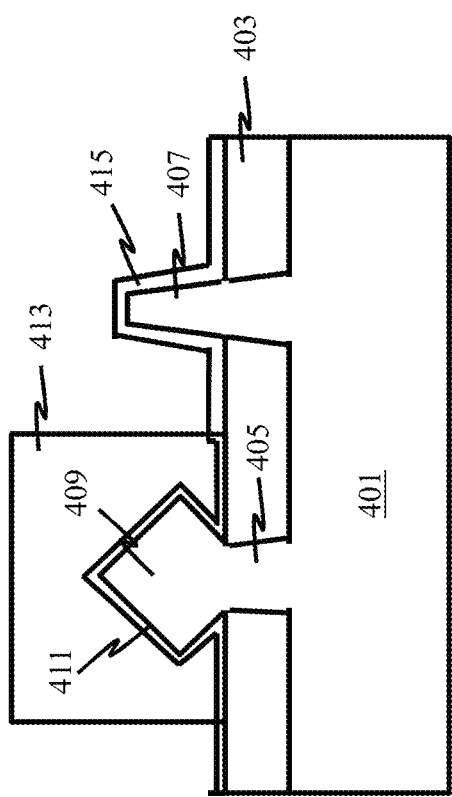

As illustrated in FIG. 4B, layer 415 is etched, for example by reactive ion etching (RIE), to expose a top of fin 407 and form sidewall spacers 417 at opposite sides of fin 407. Next, a high dose implantation is performed, as illustrated at 419 in FIG. 4C. For the high dose implantation, arsenic is implanted in fin 407 with a dose ranging from 1e14 cm$^{-3}$ to 1e16 cm$^{-3}$ and at an energy of 3 kiloelectron volts (keV) to 10 keV. Further, the arsenic is directed at fin 407 with zero tilt. It should be noted that the implantation can be performed before RIE.

Figures 4C, 4D:
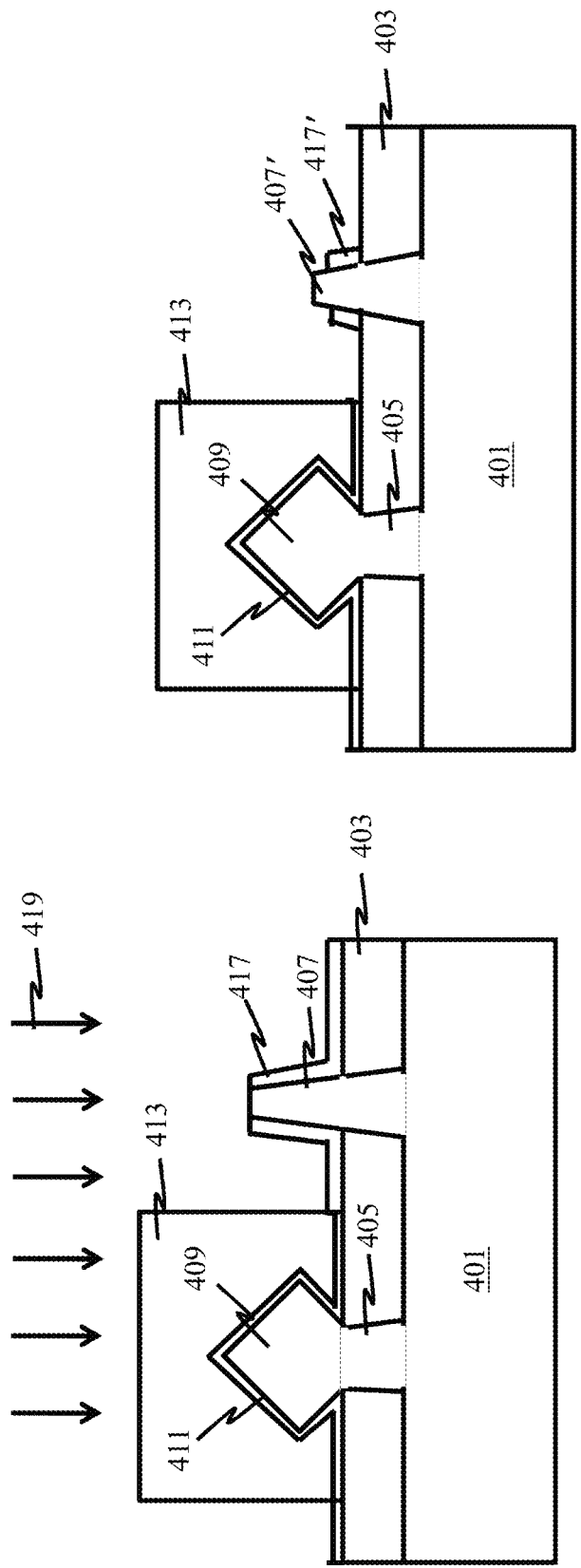

Adverting to FIG. 4D, spacers 417 are pushed down, or rather are reduced in height by 25 to 60% of the total fin height, removing the damaged fin top region and leaving spacers 417'. At the same time, a cavity is etched in fin 407 at opposite sides of the gate electrode to a depth of 25 to 60% of the total fin height, reducing fin 407 to fin 407' at the site of the cavities.

Figure 4F:
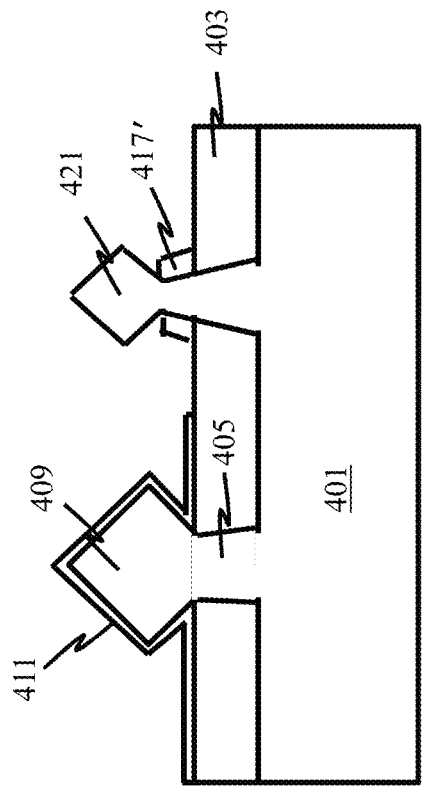
Figure 4E:
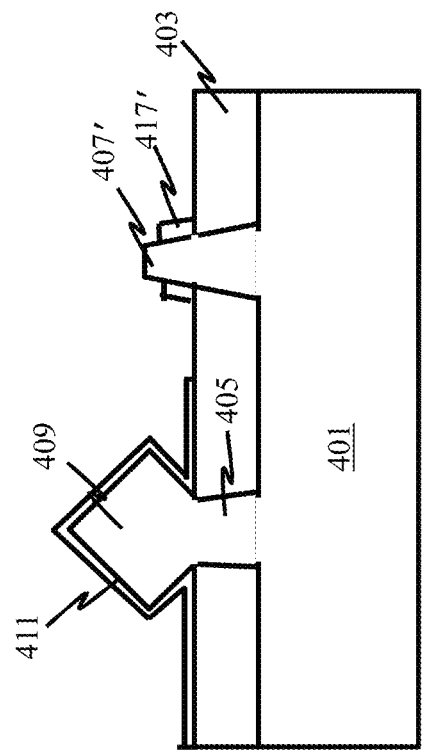
Figure 4G:
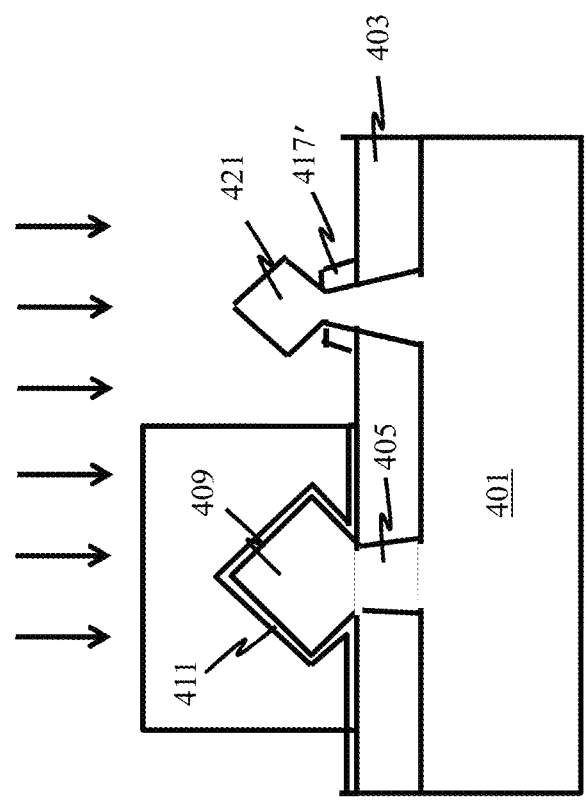

Ashing and a chemical cleaning remove the mask 413, as illustrated in FIG. 4E. A first rapid thermal anneal (RTA) is then performed to repair implantation and etch damage and to activate and drive in the dopant at the lower region of the fin. The lower part gains more thermal budget than the upper part, which is critical for a conformal junction. The RTA is performed at a temperature greater than 800° C. for 1 to 10 seconds.

As illustrated in FIG. 4F, embedded silicon phosphide (eSiP) source/drain regions 421 are epitaxially grown in the fin cavities (at opposite sides of the gate electrode) following an eSiP precleaning. Adverting to FIG. 4G, a mask 423 is formed over the PFET, and a high dose shallow implantation is performed on the NFET source/drain regions 421 for ohmic contact. Specifically, arsenic is implanted into the eSiP at a dose of 1e14 cm$^{-3}$ to 1e16 cm$^{-3}$, at an energy of 0.5 keV to 5 keV, with zero degrees of rotation, and with a maximum tilt (i.e., substantially perpendicular to the fin sidewall). The shallow implantation limits the dopant diffusion into the channel and thus controls in top dopant encroaching into the channel. The mask is then removed, another mask is formed over the NFET source/drain regions, and boron difluoride (BF$_2$) is implanted into the PFET source/drain regions (not shown for illustrative convenience). A second RTA and laser spike anneal (LSA) then drive the dopants into the source/drain regions. However, the thermal budget should be reduced to limit the phosphorus dopant diffusion.

Figure 5:
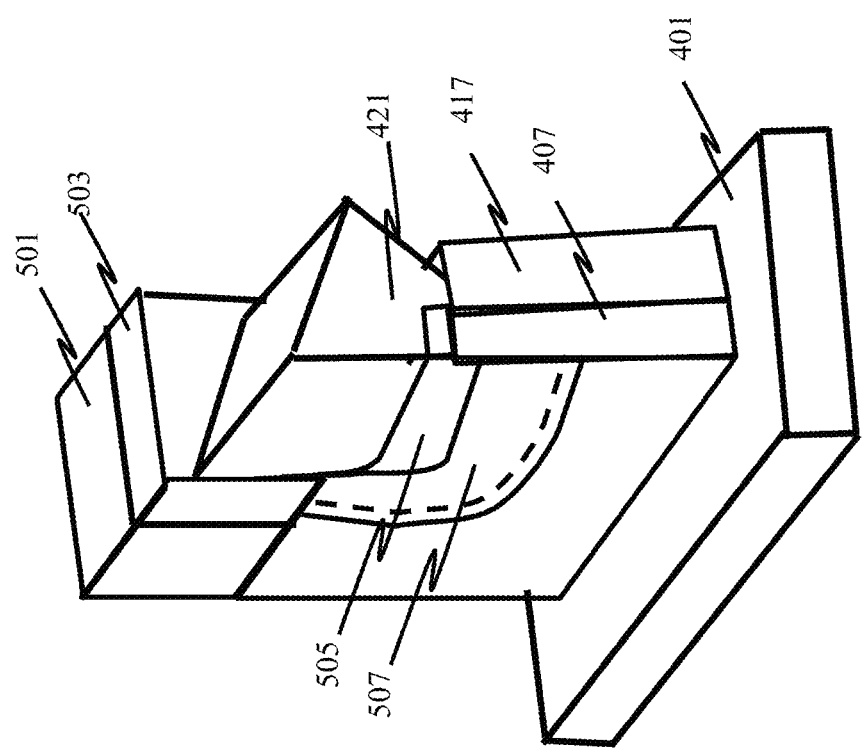
FIG. 5 schematically illustrates a three-dimensional view along the length of an NFET fin after the process flow of FIGS. 4A through 4G, in accordance with an exemplary embodiment.

FIG. 5 schematically illustrates a three-dimensional view along the length of an NFET fin after the process flow of FIGS. 4A through 4G. As illustrated, a gate electrode 501 with spacer 503 is formed over fin 407 and spacer 417 on substrate 401. eSiP source/drain region 421 is grown in the cavity 505 in the fin. The resulting implant profile 507 has a substantially vertical boundary with no tailing and no excessive dopant at the fin tip region.

The embodiments of the present disclosure can achieve several technical effects, including a fully utilized fin for current conduction, an abrupt, vertical and conformal junction, implementation of a higher implantation for ohmic contact, all of which result in an improved junction without the use of an extra mask. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated FinFET semiconductor devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a PFET fin and an NFET fin on a substrate;
   a gate electrode over and perpendicular to the PFET fin and the NFET fin;
   PFET source/drain regions on the PFET fin at opposite sides of the gate electrode; and
   epitaxially grown, arsenic doped NFET source/drain regions in cavities in the NFET fin at opposite sides of the gate electrode,
   wherein each NFET source/drain region has a conformal junction with an abrupt, vertical, and conformal junction boundary.

2. The device according to claim 1, wherein the epitaxially grown source/drain regions comprise silicon phosphide (SiP).

3. The device according to claim 1, wherein the NFET fin is implanted with arsenic at a dose of 1e14 cm$^{-3}$ to 1e16 cm$^{-3}$.

4. The device according to claim 3, wherein the arsenic is doped at an energy of 1 kiloelectron Volt (keV) to 10 keV, and a zero degree tilt prior to formation of the cavities.

5. The device according to claim 1, wherein the epitaxially grown source/drain region is doped with arsenic at a dose of 1e14 cm$^{-3}$ to 1e16 cm$^{-3}$.

6. The device according to claim 5, wherein the arsenic is doped at an energy of 0.5 keV to 5 keV, and a maximum tilt after the epitaxial growth.

7. A device comprising:
   a fin of a first polarity FET and a fin of a second polarity FET formed on a substrate;
   a gate electrode formed over and perpendicular to the fin of the first polarity FET and the fin of the second polarity FET;
   first source/drain regions formed on the fin of the first polarity FET at opposite sides of the gate electrode; and
   epitaxially grown, second source/drain regions formed in cavities in the fin of the second polarity FET at opposite sides of the gate electrode,
   wherein the second source/drain regions of the fin of the second polarity FET have a conformal junction with an abrupt, vertical, and conformal junction boundary.

8. The device according to claim 7, wherein the second polarity is opposite the first polarity.

9. The device according to claim 7, wherein the epitaxially grown second source/drain regions comprise silicon phosphide (SiP).

10. The device according to claim 7, wherein the fin of the second polarity FET is implanted with arsenic at a dose of 1e14 cm$^{-3}$ to 1e16 cm$^{-3}$.

11. The device according to claim 10, wherein the arsenic is doped at an energy of 1 kiloelectron Volt (keV) to 10 keV, and a zero degree tilt prior to formation of the cavities.

12. The device according to claim 7, wherein the fin of the second polarity FET is a NFET fin.

13. The device according to claim 7, wherein the fin of the first polarity FET is a PFET fin.

14. The device according to claim 7, wherein the epitaxially grown second source/drain regions are doped with arsenic at a dose of 1e14 $cm^{-3}$ to 1e16 $cm^{-3}$.

15. The device according to claim 14, wherein the arsenic is doped at an energy of 0.5 keV to 5 keV, and a maximum tilt after the epitaxial growth.

16. A device comprising:
a PFET fin and an NFET fin formed on a substrate;
shallow trench isolation (STI) regions formed between the PFET fin and the NFET fin;
a gate electrode formed over and perpendicular to the PFET fin and the NFET fin;
PFET source/drain regions formed on the PFET fin at opposite sides of the gate electrode;
spacers formed on sidewalls of the NFET fin on each side of the gate electrode;
a cavity formed in the NFET fin on each side of the gate electrode; and
epitaxially grown, source/drain region formed in each cavity, wherein:
arsenic is implanted into the NFET fin at a dose of 1e14 $cm^{-3}$ to 1e16 $cm^{-3}$ and with zero tilt with respect to the sidewall,
arsenic is implanted in the NFET source/drain regions at a dose of 1e14 $cm^{-3}$ to 1e16 $cm^{-3}$ and with zero degrees of rotation and a maximum tilt, and
boron or boron fluoride ($BF_2$) is implanted into the PFET source/drain regions.

17. The device according to claim 16, wherein the arsenic is implanted into the NFET fin at an energy of 3 kiloelectron Volts (keV) to 10 keV.

18. The device according to claim 16, wherein the arsenic is implanted into the NFET source/drain regions at an energy of 0.5 keV to 5 keV.

19. The device according to claim 16, wherein the epitaxially grown source/drain regions comprise silicon phosphide (SiP).

20. The device according to claim 16, wherein each epitaxially grown source/drain region has a conformal junction with an abrupt, vertical, and conformal junction boundary.

* * * * *